US010809337B2

(12) United States Patent
Huang (10) Patent No.: US 10,809,337 B2
(45) Date of Patent: Oct. 20, 2020

(54) RECONSTRUCTING MAGNETIC RESONANCE IMAGES WITH DIFFERENT CONTRASTS

(71) Applicant: Shanghai Neusoft Medical Technology Co., Ltd., Shanghai (CN)

(72) Inventor: Feng Huang, Shanghai (CN)

(73) Assignee: Shanghai Neusoft Medical Technology Co., Ltd., Shanghai (CN)

(*) Notice: Subject to any disclaimer, the term of this patent is extended or adjusted under 35 U.S.C. 154(b) by 121 days.

(21) Appl. No.: 16/050,404

(22) Filed: Jul. 31, 2018

(65) Prior Publication Data
US 2019/0033409 A1 Jan. 31, 2019

(30) Foreign Application Priority Data

Jul. 31, 2017 (CN) .......................... 2017 1 0643466
Jul. 26, 2018 (CN) ........................ 2018 1 08361519

(51) Int. Cl.
*G01R 33/56* (2006.01)
*G01R 33/48* (2006.01)
(Continued)

(52) U.S. Cl.
CPC ..... *G01R 33/5601* (2013.01); *G01R 33/4824* (2013.01); *G01R 33/543* (2013.01);
(Continued)

(58) Field of Classification Search
CPC ............ G01R 33/5601; G01R 33/4824; G01R 33/5608; G01R 33/543; G01R 33/5602;
(Continued)

(56) References Cited

U.S. PATENT DOCUMENTS 8,186,880 B1* 5/2012 Arnold .................. A61B 6/583
378/207
2010/0296717 A1* 11/2010 Takizawa ............. G01R 33/561
382/131
(Continued)

OTHER PUBLICATIONS

Majumdar, A. and Ward, R.K., 2011. Joint reconstruction of multiecho MR images using correlated sparsity. Magnetic resonance imaging, 29(7), pp. 899-906. (Year: 2011).*
(Continued)

*Primary Examiner* — Christopher P McAndrew
(74) *Attorney, Agent, or Firm* — Fish & Richardson P.C.

(57) ABSTRACT

A method and a device for reconstructing magnetic resonance images with different contrasts are provided. According to an example of the method, after collecting magnetic resonance signal data recorded in k-space of N contrasts by N number of magnetic scans, a first image for each of the contrasts may be obtained by performing image reconstruction according to the magnetic resonance signal data corresponding to the contrast; an association coefficient of each of the contrasts may be determined according to the first images for the N contrasts; and a second image shared with the N contrasts may be obtained by performing image reconstruction based on the magnetic resonance signal data of the N contrasts and the association coefficient of each of the N contrasts. In this way, a reconstructed image for each of the contrast may be obtained by combining the association coefficient of the contrast with the second image.

20 Claims, 5 Drawing Sheets (51) Int. Cl.
*G01R 33/54* (2006.01)
*G06T 5/50* (2006.01)
*G06T 5/00* (2006.01)
*G06T 11/00* (2006.01)

(52) U.S. Cl.
CPC ............ *G01R 33/5608* (2013.01); *G06T 5/50* (2013.01); *G06T 11/006* (2013.01); *G06T 11/008* (2013.01); *G06T 5/002* (2013.01); *G06T 2207/10088* (2013.01); *G06T 2207/20216* (2013.01); *G06T 2207/20221* (2013.01)

(58) Field of Classification Search
CPC .... G01R 33/5611; G01R 33/54; G01R 33/56; G01R 33/5619; G06T 5/50; G06T 11/006; G06T 11/008; G06T 2207/20221; G06T 2207/10088; G06T 5/002; G06T 2207/20216
USPC ........................................................ 324/309
See application file for complete search history.

(56) References Cited

U.S. PATENT DOCUMENTS

| | | | | |
|---|---|---|---|---|
| 2011/0080166 A1* | 4/2011 | Edelman | ............ | G01R 33/5607 324/309 |
| 2012/0063658 A1* | 3/2012 | Leroux | ................ | G06T 11/006 382/131 |
| 2012/0112743 A1* | 5/2012 | Granlund | ........... | G01R 33/5614 324/309 |
| 2012/0262172 A1* | 10/2012 | Holmes | .............. | G01R 33/5602 324/309 |

OTHER PUBLICATIONS

Bilgic, B., Goyal, V.K. and Adalsteinsson, E., 2011. Multi-contrast reconstruction with Bayesian compressed sensing. Magnetic resonance in medicine, 66(6), pp. 1601-1615. (Year: 2011).*

Huang, J., Chen, C. and Axel, L., 2014. Fast multi-contrast MRI reconstruction. Magnetic resonance imaging, 32(10), pp. 1344-1352. (Year: 2014).*

Hee Kwon Song and Lawrence Dougherty, "k-space weighted image contrast (KWIC) for contrast manipulation in projection reconstruction MRI," Magnetic Resonance in Medicine 44(6):825-832 • Dec. 2000.

Doneva, M. et al., "Compressed sensing reconstruction for magnetic resonance parameter mapping," Magnetic Resonance in Medicine 64(4), 1114-1120: Jun. 17, 2010.

Pruessmann, K. et al., "SENSE: Sensitivity Encoding for Fast MRI," Magnetic Resonance in Medicine, 42:952-962 (1999).

Chen, N. et al., "A robust multi-shot scan strategy for high-resolution diffusion weighted MRI enabled by multiplexed sensitivity-encoding (MUSE)," NeuroImage 72: 41-47 (May 15, 2013).

Lin, F. et al., "Parallel Imaging Reconstruction Using Automatic Regularization," Magnetic Resonance in Medicine 51:559-567 (2004).

Griswold, M. et al., "Generalized Autocalibrating Partially Parallel Acquisitions (GRAPPA)," Magnetic Resonance in Medicine 47:1202-1210 (2002).

* cited by examiner

RECONSTRUCTING MAGNETIC RESONANCE IMAGES WITH DIFFERENT CONTRASTS

CROSS REFERENCE TO RELATED APPLICATIONS

This application claims priority to Chinese Patent Application No. 2017106434667 filed on Jul. 31, 2017 and Chinese Patent Application No. 2018108361519 filed on Jul. 26, 2018, the entire content of which is incorporated herein by reference.

BACKGROUND

Compared with other imaging devices, images with different contrasts may be obtained by magnetic resonance imaging (MRI) device, thereby providing richer information for diagnosis.

In some applications of MRI, such as relaxation parameter imaging and fat quantitative imaging, multiple scans may be performed for the same patient in a single MRI device using the same imaging sequence and different groups of scanning parameters to obtain images with different contrasts. These images with different contrasts may include the same information, such as tissue structure information.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

In an aspect, a method of reconstructing magnetic resonance images with different contrasts includes collecting magnetic resonance signal data of each of N contrasts during N magnetic resonance scans. The magnetic resonance signal data is recorded in k-space, and N is an integer greater than or equal to 2. The method includes obtaining a first image for each of the N contrasts by performing image reconstruction according to the magnetic resonance signal data corresponding to the contrast; obtaining an association coefficient of each of the N contrasts according to the first image for each of the N contrasts; and obtaining a second image shared with the N contrasts by performing image reconstruction based on the magnetic resonance signal data of the N contrasts and the association coefficient of each of the N contrasts. The method includes obtaining a reconstructed image for each of the N contrasts by combining the association coefficient of the contrast with the second image shared with the N contrasts.

Embodiments can include one or more of the following features.

Collecting the magnetic resonance signal data for a particular contrast includes setting magnetic resonance scanning parameters for the particular contrast; and collecting J groups of k-space magnetic resonance signal data for the particular contrast by scanning in an equidistant undersampling manner according to the set magnetic resonance scanning parameters, wherein J indicates a number of collecting channels and is an integer greater or equal to 2. Collecting the magnetic resonance signal data of the contrast includes collecting magnetic resonance signal data which corresponds to a central region of the k-space and is configured to reconstruct the first image for the contrast by scanning in a full-sampling manner according to the set magnetic resonance scanning parameters. Obtaining the first image for a particular contrast includes reconstructing a pre-processed image for the particular contrast with the J groups of k-space magnetic resonance signal data of the particular contrast; and obtaining the first image for the contrast by removing noise and artifacts from the pre-processed image for the particular contrast.

Obtaining the association coefficient of a particular contrast includes obtaining an average image from the first images for the N contrasts; and obtaining an association coefficient of the particular contrast by dividing the first image for the particular contrast by the average image.

Obtaining the second image shared with the N contrasts includes establishing J*N equations $I_j^n(X) = \Sigma_{L=1}^{R} I_{ave}(X_L) rI^n(X_L) C_j(X_L)$. n refers to a serial number assigned to each of the N contrasts, $n \in \{1, 2, 3, \ldots, N\}$, j refers to a serial number assigned to each of the J collecting channels, $j \in \{1, 2, 3, \ldots, J\}$, $I_j^n(X)$ refers to data of an X-th point in a folded image corresponding to the j-th channel and the n-th contrast, R refers to an acceleration factor when scanning in an undersampling manner, $X_L$ refers to a L-th point corresponding to the data $I_j^n(X)$ in an unfolded image, $L \in \{1, 2, 3, \ldots, R\}$, $rI^n(X_L)$ refers to an association coefficient of the point $X_L$ of the n-th contrast, $I_{ave}(X_L)$ refers to a value of the point $X_L$ in the second image to be solved, $C_j(X_L)$ indicates a sensitivity in the j-th channel according to the point $X_L$. Obtaining the second image shared with the N contrasts by simultaneous solving the J*N equations.

The method includes obtaining a target image for each of the N contrasts by optimizing the reconstructed image for the contrast according to $$\hat{I}^n = \arg\min_{\hat{I}^n} \left\{ \sum_{j=1}^{J} \| A_j \hat{I}^n - I_j^n \|_2^2 + \lambda \| \hat{I}^n - I^n \|_2^2 \right\}.$$

argmin refers to argument of the minimum, n refers to a serial number assigned to each of the N contrasts, $n \in \{1, 2, 3, \ldots, N\}$, j refers to a serial number assigned to each of the collecting channels, $j \in \{1, 2, 3, \ldots, J\}$, Aj refers to an aliased encoding matrix corresponding to the j-th channel, $I_j^n$ refers to a folded image corresponding to the j-th channel and the n-th contrast, $I^n$ refers to the reconstructed image for the n-th contrast, $\lambda$ refers to a weighting parameter, $\| \|_2^2$ refers to a square of L2 norm, and $\hat{I}^n$ refers to a target image for the n-th contrast.

Collecting the magnetic resonance signal data of a particular contrast includes setting magnetic resonance scanning parameters of the particular contrast; and collecting the magnetic resonance signal data of the particular contrast which corresponds to a central region of the k-space by scanning in a full-sampling manner based on a preset collecting trajectory and the set magnetic resonance scanning parameters. The preset collecting trajectory includes a spiral trajectory and a radial trajectory. J indicates a number of collecting channels, and J groups of magnetic resonance signal data of the particular contrast are collected.

Obtaining the second image shared with the N contrasts includes establishing J*N equations $$\min_{I_{ave}} \sum_{j=1,n=1}^{j=J,n=N} \| \Gamma(I_{ave} \cdot rI^n \cdot C_j) - K_j^n \|^2.$$

Γ refers to an operation including a Fourier transform, a meshing algorithm according to the collecting trajectory, j refers to a serial number assigned to each of the J collecting channels, j∈{1, 2, 3, . . . , J}, n refers to a serial number assigned to each of the N contrasts, n∈{1, 2, 3, . . . , N}, $C_j$ refers to a sensitivity of the j-th channel, $I^n$ refers to the reconstructed image for the n-th contrast, $I_{ave}$ refers to the second image to be solved, $K_j^n$ refers to the magnetic resonance signal data corresponding to the j-th channel and the n-th contrast. Obtaining the second image shared with the N contrasts by simultaneous solving a minimum solution of the J*N equations.

The method includes obtaining a target image for each of the N contrasts by optimizing the reconstructed image for the contrast according to $$\hat{I}^n = \arg\min_{I^n} \left\{ \sum_{j=1}^{J} \| \Gamma(\hat{I}^n \cdot C_j) - K_j^n \|_2^2 + \lambda \| \hat{I}^n - I^n \|_2^2 \right\}.$$

argmin refers to argument of the minimum, j refers to a serial number assigned to each of the J collecting channels, j∈{1, 2, 3, . . . , J}, n refers to a serial number assigned to each of the N contrasts, n∈{1, 2, 3, . . . , N}, Cj refers to a sensitivity of the j-th channel, $K_j^n$ refers to the magnetic resonance signal data corresponding to the j-th channel and the n-th contrast, $I^n$ refers to the reconstructed image with the n-th contrast, λ refers to a weighting parameter, $\| \|_2^2$ refers to a square of an L2 norm, and $\hat{I}^n$ indicates the target image for the n-th contrast.

Combining the association coefficient of a particular contrast with the second image shared with the N contrasts includes multiplying the association coefficient of the particular contrast by the second image shared with the N contrasts.

In an aspect, a device for reconstructing magnetic resonance images with different contrasts includes one or more processors. By reading and executing machine readable instructions corresponding to control logic for reconstructing magnetic resonance images with different contrasts in a machine readable storage medium, the one or more processors are caused to collect magnetic resonance signal data of each of N contrasts during N magnetic resonance scans. The magnetic resonance signal data is recorded in k-space, and N is an integer greater than or equal to 2. The one or more processors are caused to obtain a first image for each of the N contrasts by performing image reconstruction according to the magnetic resonance signal data corresponding to the contrast; obtain an association coefficient of each of the N contrasts according to the first image for each of the N contrasts; obtain a second image shared with the N contrasts by performing image reconstruction based on the magnetic resonance signal data of the N contrasts and the association coefficient of each of the N contrasts; and obtain a reconstructed image for each of the N contrasts by combining the association coefficient of the contrast with the second image shared with the N contrasts.

Embodiments can include one or more of the following features.

When collecting the magnetic resonance signal data of a particular contrast, the machine executable instructions cause the one or more processors to set magnetic resonance scanning parameters of the particular contrast; and collect J groups of k-space magnetic resonance signal data of the particular contrast by scanning in an equidistant undersampling manner according to the set magnetic resonance scanning parameters. J indicates a number of collecting channels and is an integer greater or equal to 2.

When collecting the magnetic resonance signal data of the particular contrast, the machine executable instructions cause the one or more processors to collect magnetic resonance signal data which corresponds to a central region of the k-space and is configured to reconstruct the first image for the particular contrast by scanning in a full-sampling manner according to the set magnetic resonance scanning parameters.

When obtaining the first image for the particular contrast, the machine executable instructions cause the one or more processors to reconstruct a pre-processed image for the particular contrast with the J groups of k-space magnetic resonance signal data of the particular contrast; and obtain the first image for the particular contrast by removing noise and artifacts from the pre-processed image for the contrast.

When obtaining the association coefficient of a particular contrast, the machine executable instructions cause the one or more processors to obtain an average image from the first images for the N contrasts; and obtain an association coefficient of the particular contrast by dividing the first image for the contrast by the average image.

When obtaining the second image shared with the N contrasts, the machine executable instructions cause the one or more processors to establish J*N equations $I_j^n(X) = \sum_{L=1}^{R} I_{ave}(X_L) rI^n(X_L) C_j(X_L)$. n refers to a serial number assigned to each of the N contrasts, n∈{1, 2, 3, . . . , N}, j refers to a serial number assigned to each of the J collecting channels, j∈{1, 2, 3, . . . , J}, $I_j^n(X)$ refers to data of an X-th point in a folded image corresponding to the j-th channel and the n-th contrast, R refers to an acceleration factor when scanning in an undersampling manner, $X_L$ refers to a L-th point corresponding to the data $I_j^n(X)$ in an unfolded image, L∈{1, 2, 3, . . . , R}, $rI^n(X_L)$ refers to an association coefficient of the point $X_L$ of the n-th contrast, $I_{ave}(X_L)$ refers to a value of the point $X_L$ in the second image to be solved, $C_j(X_L)$ indicates a sensitivity in the j-th channel according to the point $X_L$. The machine executable instructions cause the one or more processors to obtain the second image shared with the N contrasts by simultaneous solving the J*N equations.

When collecting the magnetic resonance signal data of a particular contrast, the machine executable instructions cause the one or more processors to set magnetic resonance scanning parameters of the particular contrast; and collect the magnetic resonance signal data of the particular contrast which corresponds to a central region of the k-space by scanning in a full-sampling manner based on a preset collecting trajectory and the set magnetic resonance scanning parameters. The preset collecting trajectory includes a spiral trajectory and a radial trajectory. J indicates a number of collecting channels, and J groups of magnetic resonance signal data of the particular contrast are collected.

When obtaining the second image shared with the N, the machine executable instructions cause the one or more processors to establish J*N equations $$\min_{I_{ave}} \sum_{j=1,n=1}^{j=J,n=N} \| \Gamma(I_{ave} \cdot r^{I^n} \cdot C_j) - K_j^n \|^2.$$

Γ refers to an operation including a Fourier transform, a meshing algorithm according to the collecting trajectory, j refers to a serial number assigned to each of the J collecting channels, $j \in \{1, 2, 3, \ldots, J\}$, n refers to a serial number assigned to each of the N contrasts $n \in \{1, 2, 3, \ldots, N\}$, $C_j$ refers to a sensitivity of the j-th channel, $I^n$ refers to the reconstructed image for the n-th contrast, $I_{ave}$ refers to the second image to be solved, $K_j^n$ refers to the magnetic resonance signal data corresponding to the j-th channel and the n-th contrast. The machine executable instructions cause the one or more processors to obtain the second image shared with the N contrasts by simultaneous solving a minimum solution of the J*N equations.

When combining the association coefficient of the contrasts with the second image shared with the N contrasts, the machine executable instructions cause the one or more processors to multiply the association coefficient of the contrast by the second image shared with the N contrasts.

DETAILED DESCRIPTION

In Magnetic Resonance Imaging (MRI) technology, multiple scans, each at a different contrast, can be performed to enable a better clinical diagnosis to be obtained. In clinical practice, images with different contrasts can be valuable for medical diagnosis. For example, an image with T1 weighting (T1 represents longitudinal relaxation time) can reflect a difference in the longitudinal relaxations of tissues, which can be useful for observation of anatomical structure. An image with T2 weighting (T2 represents transverse relaxation time) can reflect a difference in the transverse relaxations of tissues, which can be useful for display of tissue lesions or other tissue features. In some examples, if a patient is scanned with only one contrast, a lesion area may not be accurately displayed in the resulting image. To diagnose a lesion accurately, the patient can be scanned for different contrasts. In some instances, multi-contrast imaging can be common in MRI applications.

Same information may be collected repeatedly for images for different contrasts during multiple MRI scans. In MRI, low frequency information is mainly contrast information, and high frequency information is mainly tissue structure information. During a series of multi-contrast scans, the tissue structure information of a patient generally remains unchanged. An approach to MRI in which tissue structure data is shared directly can save scanning time. Specifically, in a frequency space, images with different contrasts can use their respective low frequency information separately and can share high frequency information, and then the images are reconstructed. The sharing of high frequency information can be obtained by a particular contrast. Since the tissue structure information scanned at one contrast is directly shared to other contrasts, contrast contamination may arise, which can result in inaccurate imaging.

The present disclosure provides approaches for quickly and accurately reconstructing magnetic resonance images with different contrasts. Each contrast image mainly including contrast information is reconstructed separately and an association coefficient corresponding to each contrast image is calculated. A shared image can then be obtained by performing image reconstruction for the obtained magnetic resonance data according to the association coefficients. A complete reconstructed image of each contrast can be generated by synthesizing the association coefficient corresponding to each contrast image with the shared image. A characteristic of similar tissue structures and different contrasts among images with different contrasts can be used in this reconstruction process. When the characteristic is used specifically, it can be assumed that a ratio between each complete image with its respective contrast and the shared image is approximately equal to the association coefficient calculated based on the low resolution contrast image. Using these approaches for reconstructing an image, data reflecting tissue structure information may be collected only once for a particular contrast, and data reflecting image contrast information is collected for each contrast, avoiding repeated scans of the tissue structure information, and saving scanning time and cost.

The association coefficient corresponding to each contrast can be calculated and added into simultaneous equations when the tissue structure image is reconstructed. The inclusion of the associating coefficient enables the impact of the contrast to be considered during image reconstructing, reducing the occurrence of contrast contamination and improving the accuracy of the image reconstruction.

In general, the image reconstruction approaches described here enable magnetic resonance images with different contrasts to be reconstructed quickly and accurately.

Figure 1:
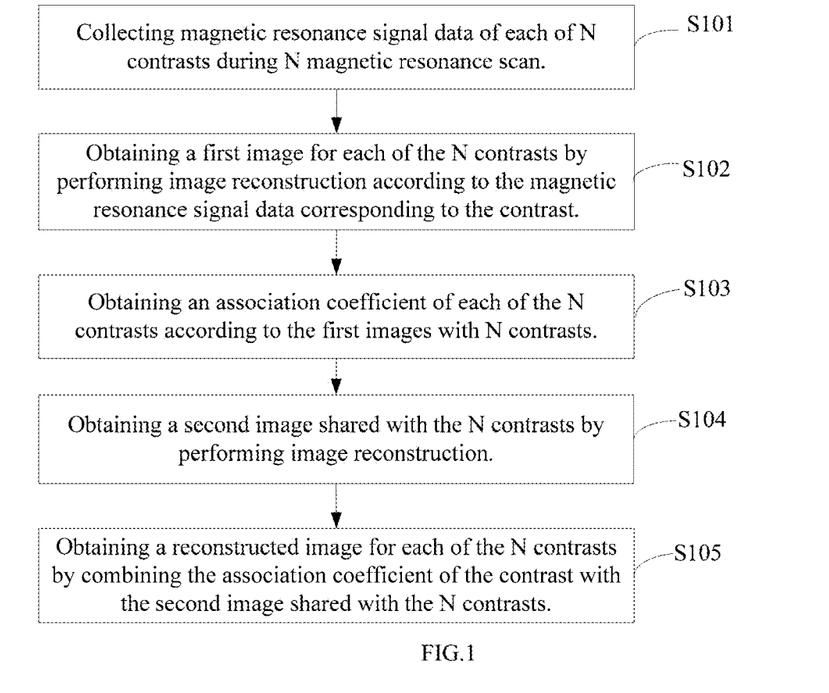
FIG. 1 is a flowchart illustrating a method of reconstructing magnetic resonance images with different contrasts.

FIG. 1 is a flowchart illustrating a method of reconstructing magnetic resonance images with different contrasts.

Data are obtained (S101) by collecting magnetic resonance signal data of N contrasts during N magnetic resonance scans, where N is an integer equal to or greater than 2.

The raw magnetic resonance signal data is recorded in k-space. The k-space data is used as second signal data. Data corresponding to a central region of the k-space is used as first signal data, where the data corresponding to the central region of the k-space is data reflecting contrast information. In some examples, N groups of the first signal data and N groups of the second signal data can be collected.

The tissue structure information can be similar across multiple scans performed at different contrasts. In some examples, N groups of the first signal data and one group of the second signal data can be collected to save magnetic resonance scanning time.

The first signal data reflecting contrast information indicates low frequency magnetic resonance signal data of the k-space, where the k-space corresponds to a spatial frequency domain. As known from a spatial encoding rule of MRI, the low frequency magnetic resonance signal data may be recorded in the central region of the k-space.

A first image $LI^n$ with a contrast is obtained (S102) by performing image reconstruction according to the magnetic resonance signal data corresponding to the contrast, where n refers to a contrast, and $n \in \{1, 2, 3, \ldots, N\}$.

An association coefficient $rI^n$ of a contrast is obtained (S103) according to the first images with N contrasts.

A second image $I_{ave}$ shared under N contrasts is obtained (S104) by performing image reconstruction based on the association coefficients $rI^n$ and the magnetic resonance signal data.

A reconstructed image $I^n$ for a contrast is generated (S105) by combining the association coefficient $rI^n$ corresponding to the contrast with the second image $I_{ave}$.

In some examples, the generation of the reconstructed image $I^n$ can include obtaining the reconstructed image $I^n$ for each contrast by multiplying $rI^n$ ($n \in \{1, 2, 3, \ldots, N\}$) by $I_{ave}$ respectively, which can be expressed as the following formula (1):

$$I^n = rI^n \times I_{ave} \qquad (1),$$

where $I^n$ refers to the reconstructed image corresponding to contrast n, $rI^n$ refers to the association coefficient of contrast n, which is obtained at S103, and $I_{ave}$ is the second image shared under N contrasts, which is obtained at S104.

For instance, the generation of the reconstructed image $I^n$ can include:

$$I^1 = rI^1 \times I_{ave}, I^2 = rI^2 \times I_{ave}, \ldots, I^n = rI^n \times I_{ave}, \ldots,$$
$$I^N = rI^N \times I_{ave}.$$

In the approaches to reconstructing MRI images with different contrasts described here, the first image for a contrast may be reconstructed according to the magnetic resonance signal data corresponding to the contrast. An association coefficient corresponding to the contrast can be calculated. The second image shared under N contrasts can be reconstructed by using the magnetic resonance signal data and the association coefficients. A complete reconstructed image for the contrast can be generated by combining the association coefficient corresponding to the contrast with the shared second image.

The association coefficient calculated based on the first image can be added during reconstruction of the second image, enabling the impact of the contrast on the shared second image to be taken into account and enabling the contrast contamination to be reduced. As a result, the imaging accuracy can be increased and the imaging quality can be improved.

In the approaches for reconstructing an image described here, the process of reconstructing the first image and the process of reconstructing the shared second image can be two different processes. The reconstruction approaches rely on a characteristic of approximately same tissue structure information. It can be assumed that a ratio between the reconstructed image for each contrast and the shared image is approximately equal to the association coefficient calculated based on the first images. In some examples, the second signal data may be collected only once for a particular contrast during data collection, while the first signal data can be collected for each contrast. This approach can enable repeated scans of the second signal data to be avoided, thereby saving scanning time and cost.

In the approaches described here, magnetic resonance images with different contrasts may be reconstructed relatively quickly and accurately.

The following provides example implementations for the reconstruction of magnetic resonance images with different contrasts.

Example 1

A precondition is firstly introduced before introduction of the first example.

A principle of MRI spatial encoding specifies that magnetic resonance signals reflecting tissue structure information belong to high frequency signals in a frequency space and are recorded in an outer peripheral region of the k-space, and a large number of signals are used to reflect the tissue structure information. Signals reflecting contrast information belong to low frequency signals in the frequency space and are recorded in a central region of the k-space, and only a small number of signals are used to reflect the contrast information. Magnetic resonance signal data reflecting contrast may be obtained by collecting signals corresponding to the central region of the k-space.

The k-space refers to a magnetic resonance signal space (a raw data space) that reflects characteristics of magnetic resonance signals in a frequency domain. Raw signal data obtained by magnetic resonance scanning are stored in the k-space, and a magnetic resonance image can be obtained by transforming (e.g., by Fourier transform) the data in the k-space.

The magnetic resonance scanning may be performed line-by-line. In a line-by-line scan, the time involved in scanning one line is very short, but there can be a long wait when the scan is switched from one line to another, that is, phase encoding is performed. The time consumed by line-by-line magnetic resonance scanning mainly comes from the waiting time of line switching. In some examples, a parallel imaging technology can be used to assist in the location of a spatial position of an MR signal by using receiving coils with known placing positions and sensitivities. With the additional information of the coils, the number of phase encoding steps can be reduced during image collection, meaning that the number of scanning lines can be reduced, thereby reducing the number of times line switching occurs and decreasing the scanning time. The manner of collecting data by reducing the number of scanning lines is also referred to as undersampling.

Using parallel imaging technology, magnetic resonance signal data may be reconstructed by using a SENSitivity Encoding (SENSE) acceleration method. In the SENSE acceleration method, multiple coils may be used as multiple collecting channels during signal collection, where signals close to the coil are stronger, and signals further from the coil are weaker. A magnetic resonance image is reconstructed using known coil sensitivity information. The SENSE acceleration method enables a high quality magnetic resonance image to be reconstructed using sensitivity information for each collecting channel.

In some examples, when the magnetic resonance signal data is collected by performing a scan in the equidistant undersampling manner, an image that is reconstructed directly based on the magnetic resonance signal data may be folded due to an insufficient sampling rate, which is called a folded image.

The FOV (Field of View) of each folded image is related to an acceleration factor of the data collection. The acceleration factor is the reciprocal of the undersampling factor. Assuming that the acceleration factor of the data collection is R, the FOV of each folded image is 1/R of an original image, and the undersampling factor is 1/R.

In a specific example, a pixel point array is 256*256 and an undersampling factor is 4. In this example, the original image is folded 4 times, and data of the $1^{st}$ line, the $65^{th}$ line (1+64), the $129^{th}$ line (1+64+64), and the $193^{rd}$ line (1+64+64+64) of the original image are folded together. The data corresponding to the $2^{nd}$ line, the $66^{th}$ line, the $130^{th}$ line and the $194^{th}$ line of the original image are folded together, and so on. In this way, the original image is folded 4 times.

The sampling data corresponding to the $1^{st}$ line in the folded image is the data corresponding to the $1^{st}$ line, the $65^{th}$ line, the $129^{th}$ line and the $193^{rd}$ line of the original image. The sampling data corresponding to the $2^{nd}$ line in the folded image is the data corresponding to the $2^{nd}$ line, the $66^{th}$ line, the $130^{th}$ line and the $194^{th}$ line of the original image. In this way, one image of 256*256 is folded 4 times and changed into an image which the FOV is 64*256 (256/4*256). Each point on the folded image corresponds to four points of the original image.

Figure 2A:
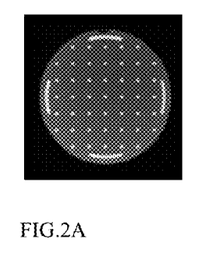
FIG. 2A to FIG. 2D illustrate images obtained respectively by scanning in a full-sampling manner and different undersampling manners of factors of 50%, 25% and 12.5%.
Figure 2B:
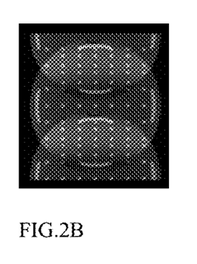
Figure 2C:
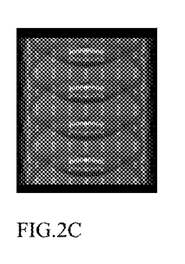
Figure 2D:
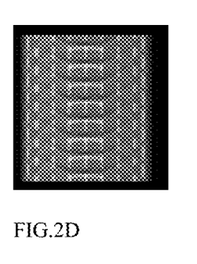

In other words, the number of times that the image is folded is related to a factor of undersampling. FIG. 2A to FIG. 2D illustrate image obtained respectively by scanning in a full-sampling manner (FIG. 2A) and undersampling manners of factors of 50%, 25% and 12.5% (FIGS. 2B-2D, respectively). As shown in FIG. 2B, when the sampling points of an undersampling are 50% of the sampling points of a full-sampling, meaning that the sampling speed is accelerated twofold, the image is folded twice, and each sampling point on the folded image is formed by folding 2 points of the original image. As shown in FIG. 2C, when the sampling points of an undersampling are 25% of the sampling points of a full-sampling, meaning that the sampling speed is accelerated fourfold, the image is folded 4 times, and each sampling point on the folded image is formed by folding 4 points of the original image. As shown in FIG. 2D, when the sampling points of an undersampling are 12.5% of the sampling points of a full-sampling, meaning that the sampling speed is accelerated eightfold, the image is folded 8 times, and each sampling point on the folded image is formed by folding 8 points of the original image.

In an example, when the sampling points of an undersampling are set to ¼ of the sampling points of a full-sampling, data is collected every 4 lines, so that, e.g., collected pixel lines include the $1^{st}$ line, the $5^{th}$ line, the $9^{th}$ line, ..., the (4m+1)-th line, .... Since the number of lines of the sampling points is ¼ of the number of lines of a full-sampling, the speed of magnetic resonance scanning may be accelerated fourfold, and the original image is folded 4 times. An unfolded original image can be solved from the folded image by performing further image reconstruction.

Figure 3:
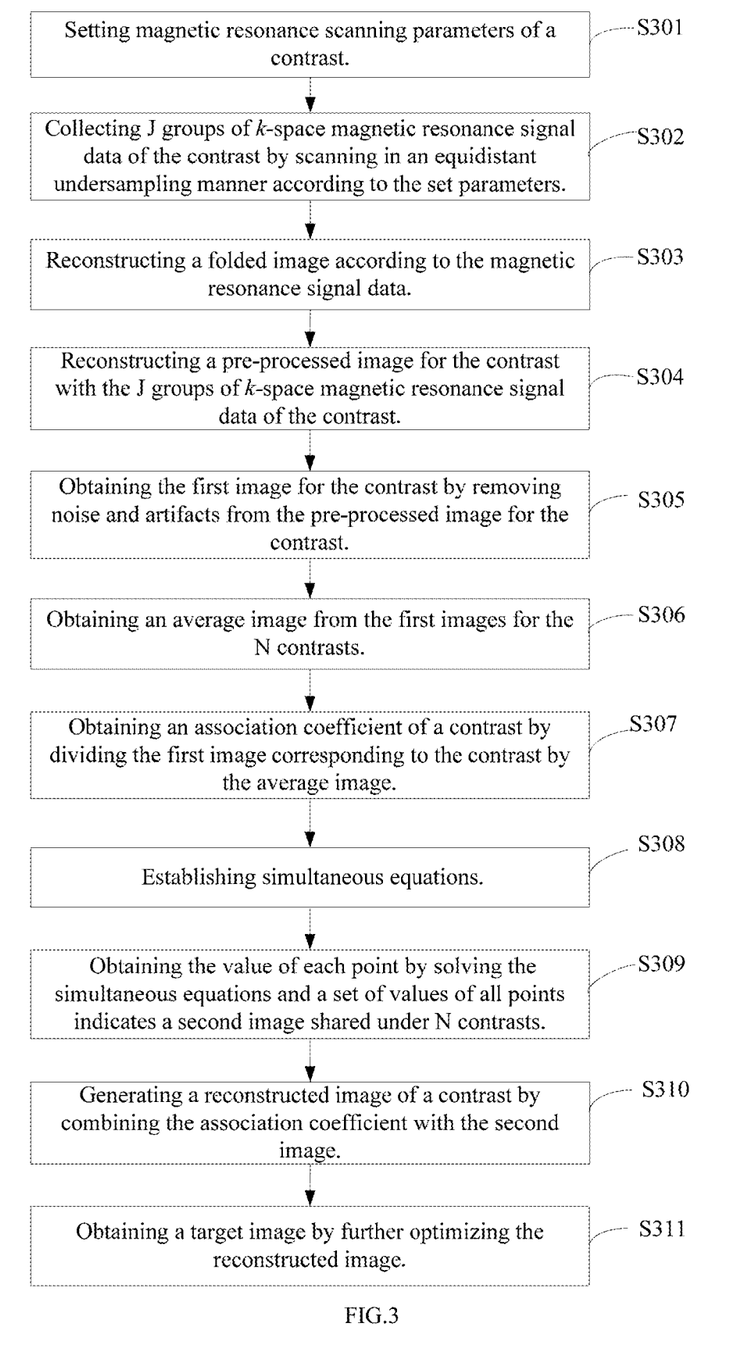
FIG. 3 is a flowchart illustrating a method of reconstructing magnetic resonance images with different contrasts.

Based on the above precondition, an example process of collecting magnetic resonance signal data and reconstructing an image is shown in FIG. 3.

Magnetic resonance scanning parameters for a contrast are set (S301). In some examples, the magnetic resonance scanning parameters can be standard magnetic resonance scanning parameters.

A patient is scanned in an equidistant undersampling manner (S302) according to the set magnetic resonance scanning parameters, and magnetic resonance signal data for each contrast are collected.

J groups of k-space magnetic resonance signal data $P_j^n$ are collected for each contrast. n refers to a contrast, $n \in \{1, 2, 3, \ldots, N\}$, and N indicates a number of contrasts to be scanned and is an integer greater than or equal to 2. j refers to a collecting channel, $j \in \{1, 2, 3, \ldots, J\}$, and J indicates a number of collecting channels, and is an integer greater than or equal to 2. $P_j^n$ refers to k-space magnetic resonance signal data collected in the j-th channel of the n-th contrast.

In some examples, the scan can be performed with an acceleration factor of 4 for each contrast using a MRI device having J collecting channels according to the set magnetic resonance scanning parameters. In some examples, the collected magnetic resonance signal data corresponding to the contrast 1 include $P_1^1, P_2^1, \ldots, P_J^1$, and the magnetic resonance signal data corresponding to the contrast n include $P_1^n, P_2^n, \ldots, P_J^n$. J groups of k-space magnetic resonance signal data are collected for one contrast, and J*N groups of k-space magnetic resonance signal data $P_j^n$ are collected in total for N contrasts.

Each group of k-space magnetic resonance signal data $P_j^n$ is referred as second signal data, which can reflect contrast information as well as the tissue structure information.

To reconstruct an image, a corresponding folded image $I_j^n$ is directly reconstructed (S303) according to the magnetic resonance signal data $P_j^n$, where $I_j^n$ refers to a folded image corresponding to the j-th channel with the n-th contrast.

Each folded image $I_j^n$ reflects not only contrast information, but also reflects tissue structure information.

J folded images $I_j^n$ with a same contrast are reconstructed (S304) into a pre-processed image $\tilde{I}^n$ for the same contrast.

The reconstruction of the J folded images into the pre-processed image can include the following aspects. A pre-processed image $\tilde{I}^1$ for the contrast 1 is reconstructed by synthesizing J folded images $I_1^1, I_2^1, \ldots, I_J^1$ with the contrast 1 together, e.g., according to a SENSE method or other synthesis method. A pre-processed image $\tilde{I}^n$ for the contrast 2 is reconstructed by synthesizing J folded images $I_1^2, I_2^2, \ldots, I_J^2$ with the contrast 2 together. Based on these reconstructions, a pre-processed image $\tilde{I}^N$ for the contrast N may be reconstructed by synthesizing J folded images $I_1^N, I_2^N, \ldots, I_J^N$ with the contrast N together. In this way, N pre-processed images $\tilde{I}^1, \tilde{I}^2, \ldots, \tilde{I}^n, \ldots, \tilde{I}^N$ for N contrasts may be obtained at S304.

The synthesized pre-processed image $\tilde{I}^n$ for a contrast may include information reflecting the contrast and information reflecting a tissue structure.

After reconstruction, the pre-processed image $\tilde{I}^n$ for each contrast is an image with a full Field of View (FOV).

A first image $LI^n$ for each of the contrasts is obtained (S305) by removing noise and artifacts from the pre-processed image for each respective contrast.

The above N pre-processed images $\tilde{I}^1, \tilde{I}^2, \ldots, \tilde{I}^n, \ldots, \tilde{I}^N$ respectively include information reflecting a contrast and information reflecting a tissue structure. In some examples, the tissue structure information can bring noise and artifacts when reconstructing the first images based on the pre-processed images. Removing tissue structure information from the pre-processed images can decrease the noise and artifacts in the first images.

Signals reflecting contrast information are mainly low frequency signals, and signals reflecting tissue structure information are mainly high frequency signals. In some examples, to obtain the first image $LI^n$ with good quality, the pre-processed image for the contrast can be filtered by a low-pass filter. The low-pass filter can remove high frequency signal data from the image, and only retain low frequency signal data in the image, so that noise and artifacts are removed to obtain better first images $LI''$.

Since the pre-processed image $\tilde{I}''$ for a contrast is an image with a full FOV, the first image $LI''$ for the contrast obtained by removing noise and artifacts from $\tilde{I}''$ is also an image with a full FOV.

Further, block 304 and block 305 are not limited in sequence but can also be carried out in opposite order. Specifically, removing noise and artifacts from magnetic resonance signal data $P_j''$ can be performed first, and then the processed magnetic resonance signals may be synthesized to reconstruct the first image $LI''$.

An average image $LI_{ave}$ is obtained (S306) according to first images $LI''$ with N contrasts according to the following formula (2):

$$LI_{ave} = \Sigma_{n=1}^{N} LI''/N \quad (2).$$

An association coefficient $rI''$ of a contrast can be obtained (S307) by dividing the first image $LI''$ corresponding to the contrast by the average image $LI_{ave}$, for instance, according to formula (3):

$$rI'' = LI''/LI_{ave} \quad (3).$$

In some examples, the first image $LI''$ can be regarded as a matrix, and a value of each point in the matrix is the value of the corresponding coordinate point of the first image. Correspondingly, formulas (2) and (3) are matrix operations, and values of each coordinate point of the average image $LI_{ave}$ and the association coefficient $rI''$ are calculated respectively.

Simultaneous equations including J*N equations are established (S308) according to formula (4):

$$I_j^n(X) = \Sigma_{L=1}^{R} I_{ave}(X_L) rI^n(X_L) C_j(X_L) \quad (4),$$

where n refers to a contrast, $n \in \{1, 2, 3, \ldots, N\}$, j refers to a collecting channel, $j \in \{1, 2, 3, \ldots, J\}$, and $I_j^n(X)$ refers to the X-th data of a folded image corresponding to the j-th channel with the n-th contrast; R refers to an acceleration factor, $X_L$ refers to the L-th point of an unfolded original image corresponding to $I_j^n(X)$, and $L \in \{1, 2, 3, \ldots, R\}$. As described above, a corresponding relationship between the point $X_L$ and the point X can be calculated based on R, L and a sampling method. $rI^n(X_L)$ refers to an association coefficient of the point $X_L$ of the n-th contrast, $I_{ave}(X_L)$ refers to a value of the point $X_L$ of an image to be solved, and $C_j(X_L)$ refers to sensitivity in the j-th channel according to the point $X_L$, and may be obtained, e.g., based on a known coil sensitivity map.

The formula (4) indicates that a weight may be obtained by multiplying the association coefficient $rI''$ by the sensitivity of the collecting channel. Accelerating the sampling by R, the data $I_j''(X)$ of the folded image can be obtained by weighted superimposing R points of an image to be solved. Each point of the image has a different weight when generating the folded image. The data $I_j''(X)$ can be directly reconstructed from the signal data collected by scanning in an undersampling manner.

One formula (4) can be established for the data $I_j''(X)$ of point X in a folded image. The unknowns $I_{ave}(X_L)$ can be solved jointly by the J folded images with N contrasts, meaning that J*N equations can be established as simultaneous equations.

The simultaneous equations (5) can be as follows:

$$\begin{cases} I_1^1(X) = \sum_{L=1}^{R} I_{ave}(X_L) rI^1(X_L) C_1(X_L) \\ I_2^1(X) = \sum_{L=1}^{R} I_{ave}(X_L) rI^1(X_L) C_2(X_L) \\ \ldots \\ I_J^1(X) = \sum_{L=1}^{R} I_{ave}(X_L) rI^1(X_L) C_J(X_L) \end{cases} \quad (5)$$

$$\begin{cases} I_1^2(X) = \sum_{L=1}^{R} I_{ave}(X_L) rI^2(X_L) C_1(X_L) \\ I_2^2(X) = \sum_{L=1}^{R} I_{ave}(X_L) rI^2(X_L) C_2(X_L) \\ \ldots \\ I_J^2(X) = \sum_{L=1}^{R} I_{ave}(X_L) rI^2(X_L) C_J(X_L) \end{cases}$$

$$\ldots$$

$$\begin{cases} I_1^N(X) = \sum_{L=1}^{R} I_{ave}(X_L) rI^N(X_L) C_1(X_L) \\ I_2^N(X) = \sum_{L=1}^{R} I_{ave}(X_L) rI^N(X_L) C_2(X_L) \\ \ldots \\ I_J^N(X) = \sum_{L=1}^{R} I_{ave}(X_L) rI^N(X_L) C_J(X_L) \end{cases},$$

where R, $I_j''(X)$, $rI''(X_L)$, and $C_j(X_L)$ are all known, and $I_{ave}(X_L)$ are unknowns. Different equations in the simultaneous equations (5) have same unknowns $I_{ave}(X_L)$, and these unknowns $I_{ave}(X_L)$ are values of an image to be solved. The equations have a solution when the number of simultaneous equations is greater than or equal to the number of unknowns.

The value $I_{ave}(X_L)$ of each point $X_L$ is obtained (S309) by solving the simultaneous equations, and a set of values of all points indicates a second image $I_{ave}$ shared with N contrasts.

A reconstructed image $I''$ of a contrast is generated (S310) by combining the association coefficient $rI''$ corresponding to the contrast with the second image $I_{ave}$.

Specifically, as known from the formula (1), a reconstructed image $I^1$ with the contrast 1 is generated by multiplying the association coefficient $rI^1$ of the contrast 1 by the second image $I_{ave}$. A reconstructed image $I^2$ with the contrast 2 is generated by multiplying the association coefficient $rI^2$ of the contrast 2 by the second image $I_{ave}$ and so on, until a reconstructed image $I^N$ with the contrast N is obtained.

In some examples, the quality of the reconstructed image $I''$ with each contrast obtained at block S310 may not be good. To improve or optimize quality of the reconstructed images $I''$, a target image is obtained by further optimizing the reconstructed image $I''$ (S311), e.g., according to formula (6):

$$\hat{I}^n = \arg\min_{\hat{I}^n} \left\{ \sum_{j=1}^{J} \| A_j \hat{I}^n - I_j^n \|_2^2 + \lambda \| \hat{I}^n - I^n \|_2^2 \right\}, \quad (6)$$

where argmin stands for argument of the minimum, referring to a variable value enabling a target function listed subsequently to be a minimum value; j refers to a collecting channel; $A_j$ refers to an aliased encoding matrix corresponding to the j-th channel; $I_j''$ refers to a folded image corresponding to the j-th channel with the n-th contrast; $I''$ refers to the reconstructed image for the n-th contrast obtained at block S310; $\lambda$ refers to a weighting parameter, $\| \|_2^2$ refers to a square of an L2 norm, and $\hat{I}''$ refers to the target image for the n-th contrast to be solved.

The formula (6) may be taken as an optimized model, where the first term is a data fidelity term and the second term is a constraint term. When a value of the data fidelity term is larger, the larger weighting parameter of the constraint term may constrain an optimized result to be closer to the reconstructed image $I''$. When the value of the data fidelity term is smaller, the smaller weighting parameter of the constraint term may weaken the impact of the reconstructed image $I''$, making the optimized result closer to the folded image $I_j''$. The target image can be a result of weighting on the data fidelity term and the constraint term.

In the foregoing example, the second image is used as a shared image. After the reconstruction of the second image is completed, the second image is multiplied by an association coefficient of another contrast to generate a reconstructed image corresponding to the contrast. The association coefficients are added into the simultaneous equations for solving the second image, meaning that an influence of the contrast on the shared second image is taken into account, thereby reducing the problem of contrast contamination. As a result, this approach to reconstructing an image is capable of improving the imaging accuracy and increasing the imaging quality. In addition, in this example, the reconstruction of the second image $I_{ave}$ is implemented by solving linear equations. Since iteration and parameter adjustment do not exist in a process of solving the linear equations, the method of reconstructing magnetic resonance images with different contrasts according to this example has a relatively high stability.

Example 2

In Example 1, the first image for a contrast is obtained by reconstructing the pre-processed image for the contrast with the second signal data obtained by scanning, and then removing noise and artifacts of the pre-processed image of the contrast. To omit the processes of removing noise and artifact of the image, which in turn can reduce processing time, magnetic resonance data reflecting contrast information can be directly collected and used to reconstruct a corresponding contrast information image, as described in Example 2.

There are many similarities between the second example and the first example. For simplicity, differences between the two examples will be emphasized in the second example, and the similarities between the two examples may be referred to the related description in the first example.

Figure 4:
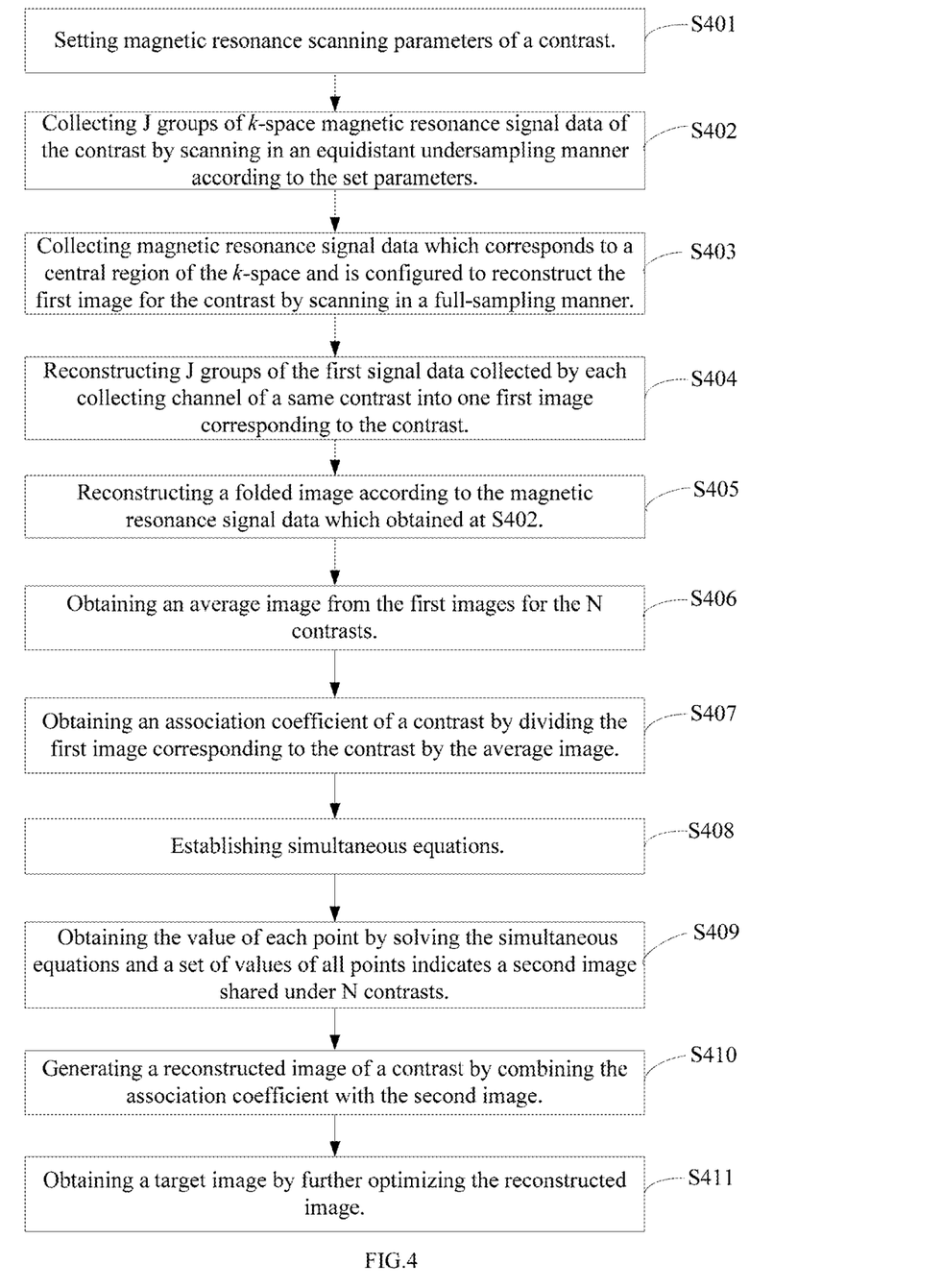
FIG. 4 is a flowchart illustrating a method of reconstructing magnetic resonance images with different contrasts.

FIG. 4 is a flowchart illustrating a second example that includes a data collecting process and an image reconstructing process. The data collecting process may include the following blocks.

S401 and S402 are same as S301 and S302 in the first example, and will not be repeated herein for simplicity.

Magnetic resonance signal data substantially corresponding to a central region of the k-space of a contrast is collected (S403) by scanning in a full-sampling manner according to set magnetic resonance scanning parameters, and the magnetic resonance signal data is configured to reconstruct the first images for the contrast.

A principle of MRI spatial encoding specifies that each row of the k-space has a dedicated phase encoding. If the rows near the central region of the k-space are determined, the corresponding phase encoding lines can be determined. Then corresponding magnetic resonance scanning parameters can be set to achieve collection of magnetic resonance signal data substantially corresponding to a central region of the k-space.

The magnetic resonance signal data corresponding to the central region of the k-space indicates the first signal data $LI_j''$ reflecting contrast information. J groups of the first signal data $LI_j''$ are obtained for each contrast.

Herein, n refers to a contrast, $n \in \{1, 2, 3, \ldots, N\}$, j refers to a collecting channel, and $j \in \{1, 2, 3, \ldots, J\}$. In some examples, to directly reconstruct first images with less noise and fewer artifacts, the data collecting process can also include collecting magnetic resonance signal data corresponding to the central region of the k-space for each contrast according to the set magnetic resonance scanning parameters. The first signal data is collected while the second signal data is collected by scanning in an equidistant undersampling manner. In an example, assuming that the k-space is represented with an array of 256*256, the magnetic resonance scanning parameters may be set to collect data corresponding to the central region of the k-space array. The central region of the k-space array may include 32 lines, for example, lines from the $113^{th}$ line to the $144^{th}$ line.

Since the first data of each contrast in this example is collected separately, magnetic resonance signal data may be collected by only one equidistant undersampling at block S402.

S403 and S402 are not limited in sequence and can be carried out in any order.

The image reconstructing process may include the following blocks.

J groups of the first signal data $LI_j''$ collected (S404) by each collecting channel of a same contrast are synthesized into one synthetic image $LI''$ through reconstruction, where the synthetic image is a first image $LI''$ corresponding to the contrast.

In some examples, the data synthesis can include synthesizing the first signal data $LI_1^1, LI_2^1, \ldots, LI_j^1, \ldots, LI_J^1$ of the contrast 1 obtained at block S403 into one first image $LI^1$ and synthesizing the first signal data $LI_1^2, LI_2^2, \ldots, LI_j^2, \ldots, LI_J^2$ of the contrast 2 obtained at S403 into one first image $LI^2$ and so on until one first image $LI^N$ is reconstructed by synthesizing the first signal data $LI_1^N, LI_2^N, \ldots, LI_j^N, \ldots, LI_J^N$ of the contrast N obtained at S403.

In some examples, although the collected data can be low resolution, during the synthesizing, technologies such as filtering, thresholding and point estimation can generate the first images with full FOV.

S405 is same as S303 in the first example and will not be repeated herein for simplicity.

S406 to S411 are same as S306 to S311 in the first example, and will not be repeated herein for simplicity. Reference may be made to relevant descriptions of S306 to S311 in the first example for detailed information.

In Example 2, to reduce repeated scans of the second signal data, the second signal data may be collected only once to reconstructed the second image $I_{ave}$. For the simultaneous equations (5), when the number of equations is greater than or equal to the number of unknowns, then the equations set has a solution. In this case, the number of equations is determined by the collecting channels. In this way, the second image may still be solved even though there is only one folded image.

In some examples, the second image can be used as a shared image when the image for each contrast is reconstructed. The first signal data is low resolution, which means that using the second image as a shared image can save scanning time and improve the speed of MRI.

In Example 2, the first image under each contrast that directly reconstructed according to the first signal data can satisfy image quality criteria without further removal of noise and artifacts from the reconstructed image, further simplifying the image reconstruction procedure.

Example 3

In some examples, data collection can be performed by a Cartesian method of line-by-line scanning (e.g., as in the first example and the second example). In some examples, such as in Example 3, the magnetic resonance signal data may be collected by non-Cartesian k-space trajectories such as spiral, radial, or other trajectories.

Figure 5:
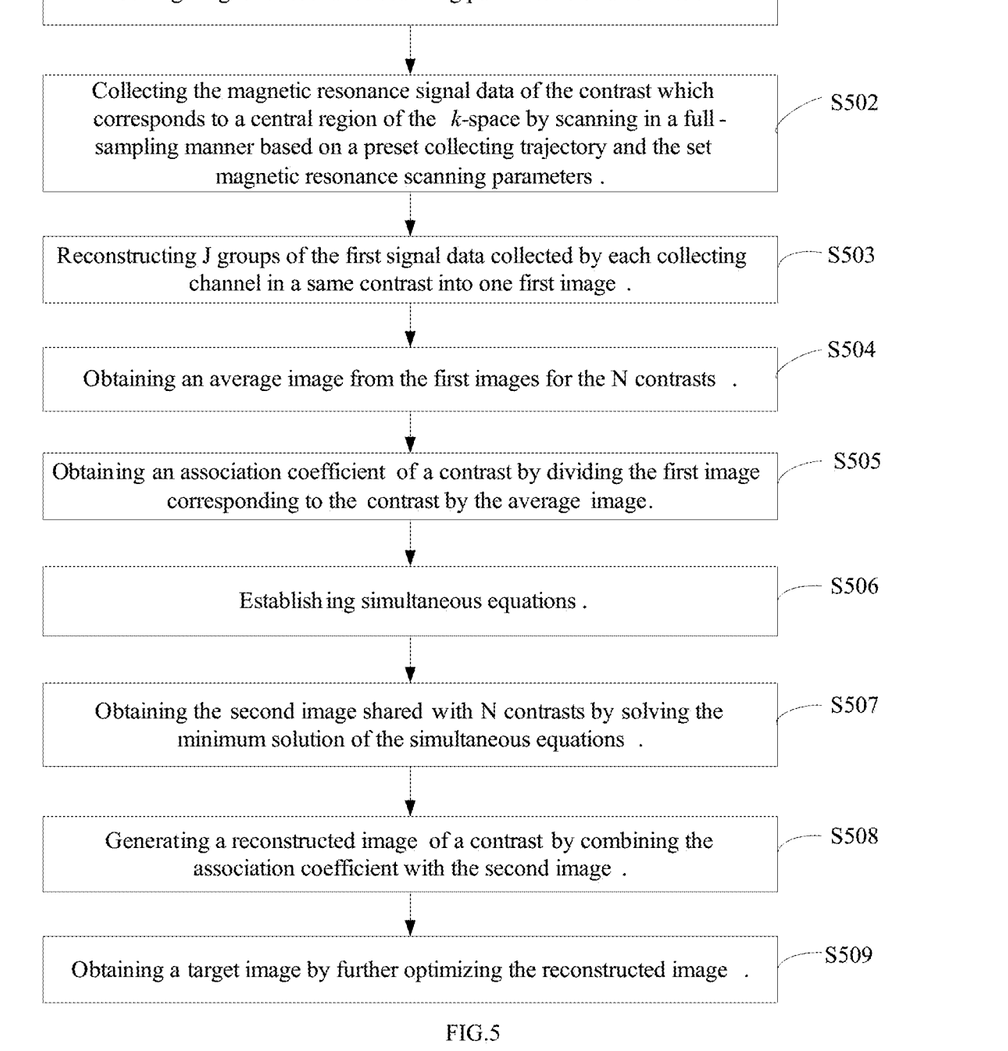
FIG. 5 is a flowchart illustrating a method of reconstructing magnetic resonance images with different contrasts.

FIG. 5 is a flowchart illustrating the approach of Example 3.

Magnetic resonance scanning parameters of a contrast are set (S501).

Magnetic resonance signal data of each contrast which corresponds to a central region of the k-space are collected (S502) respectively by scanning in a full-sampling manner based on a preset collecting trajectory and the set magnetic resonance scanning parameters.

The magnetic resonance signal data of each contrast are taken as second signal data, and the magnetic resonance signal data corresponding to the central region of the k-space are taken as first signal data. The preset collecting trajectory may be a spiral trajectory or a radial trajectory. $LI_j^n$ refers to the first signal data collected in the j-th channel of the n-th contrast, $K_j^n$ refers to the second signal data collected in the j-th channel of the n-th contrast, n refers to a contrast, n∈{1, 2, 3, . . . , N}, N refers to the number of contrasts, and is an integer greater than or equal to 2; j refers to a collecting channel, j∈{1, 2, 3, . . . , J}, J is the number of collecting channels, and is a integer greater than or equal to 2.

For data collection based on a non-Cartesian coordinate system, the collected data corresponding to the central region of k-space are oversampled. Based on the sampling density, the scale of the centre region of the k-space to which the obtained first signal data $LI_j^n$ corresponds can be determined.

Figure 6A:
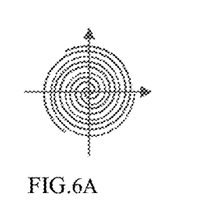
FIG. 6A illustrates a spiral collecting trajectory.
Figure 6B:
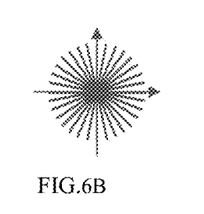
FIG. 6B illustrates a radial trajectory.
Figure 6C:
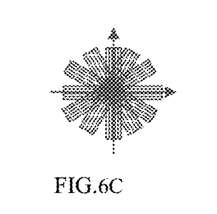
FIG. 6C illustrates a propeller trajectory.

FIG. 6A illustrates a spiral collecting trajectory. FIG. 6B illustrates a radial trajectory. FIG. 6C illustrates a PROPELLER trajectory. The radial trajectory and the PROPELLER trajectory are generally the same in sampling principle except that a number of lines per sample are different. When the radial trajectory is used for sampling, one line is collected each time. When the PROPELLER trajectory is used for sampling, multiple lines are collected each time.

J groups of the first signal data $LI_j^n$ collected by each collecting channel in a same contrast are synthesized (S503) into one synthetic image $LI^n$ by a SENSE method, where the synthetic image $LI^n$ is a first image for the contrast.

Similar to S404, the $LI^n$ generated here is also an image with a full FOV.

S504 and S505 are same as block S306 and block S307 in the first example, and will not be repeated herein for brevity.

J*N simultaneous equations (7) are established (S506) as follows:

$$\min_{I_{ave}} \sum_{j=1,n=1}^{j=J,n=N} \| \Gamma(I_{ave} \cdot rI^n \cdot C_j) - K_j^n \|^2, \quad (7)$$

where $\Gamma$ refers to an operation including a Fourier transform, a meshing algorithm according to the collecting trajectory. Specifically, the processing of $\Gamma$ refers to a Fourier transform based on a Cartesian coordinate system, and a data mapping of the Cartesian coordinate system and a non-Cartesian coordinate system according to the collecting trajectory.

In the established simultaneous equations (7), $rI^n$, $C_j$ and $K_j^n$ are all known, but $I_{ave}$ is unknowns. A shared second image can be obtained by solving the minimum solution of the equation set (7).

The second image $I_{ave}$ shared with N contrasts is obtained (S507) by solving the minimum solution of the simultaneous equations (7).

S508 is same as S310 in the first example which a reconstructed image $I^n$ of a contrast is generated, and will not be repeated herein for brevity.

A target image is obtained (S509) by further optimizing the reconstructed image $I^n$, e.g., as shown in formula (8), $$\hat{I}^n = \arg\min_{\hat{I}^n} \left\{ \sum_{j=1}^{J} \| \Gamma(\hat{I}^n \cdot C_j) - K_j^n \|_2^2 + \lambda \| \hat{I}^n - I^n \|_2^2 \right\}, \quad (8)$$

where argmin stands for argument of the minimum, referring to a variable value enabling a target function listed subsequently to be a minimum value; j refers to a collecting channel; $C_j$ refers to coil sensitivity of the j-th channel; $K_j^n$ refers to the second data corresponding to the j-th channel with the n-th contrast obtained at S502; $I^n$ refers to the reconstructed image for the n-th contrast obtained at block S508; λ refers to a weighting parameter; $\| \|_2^2$ refers to a square of an L2 norm; and $\hat{I}^n$ refers to the target image for the n-th contrast to be solved.

The formula (8) may be taken as an optimized model, where the first term is a data fidelity term and the second term is a constraint term. When a value of the data fidelity term is larger, the larger weighting parameter of the constraint term may constrain an optimized result to be closer to the reconstructed image $I^n$. When the value of the data fidelity term is smaller, the smaller weighting parameter of the constraint term may weaken the impact of the reconstructed image $I^n$, making the optimized result closer to a result obtained by calculating with the second data $K_j^n$ based on the $\Gamma$ operation. Therefore, the target image can be a result of weighing on the data fidelity term and the constraint term.

In Example 3, magnetic resonance signal data is collected based on non-Cartesian k-space trajectories. When a tissue structure information image is reconstructed, the image may be obtained by solving a minimum solution of equations.

Figure 7:
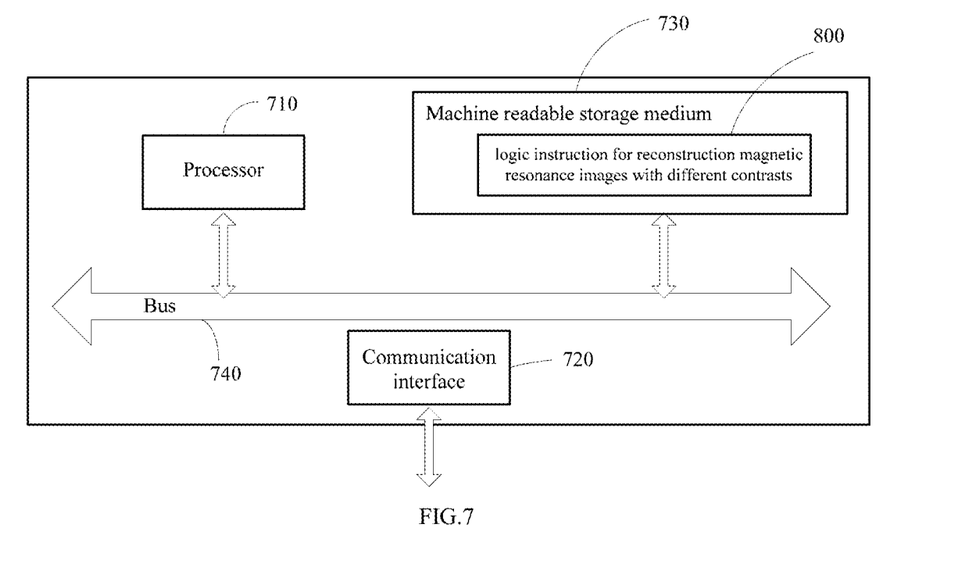
FIG. 7 is a block diagram of a device for reconstructing magnetic resonance images with different contrasts.

Magnetic resonance images with different contrasts can be reconstructed by execution of processing steps by a device shown in FIG. 7. The device shown in FIG. 7 may include one or more processors 710, a communication interface 720, a machine readable storage medium 730, and a bus 740. The one or more processors 710, the communication interface 720, and the machine readable storage medium 730 may communicate with one another via the bus 740.

In some examples, the machine readable storage medium 730 can be a Random Access Memory (RAM), a volatile memory, a non-volatile memory, a flash memory, a storage drive (e.g., hard disk drive), a solid state hard disk, any type of storage disk (e.g., compact disk, Digital Video Disk (DVD)), or a similar storage medium, or a combination thereof.

Figure 8:
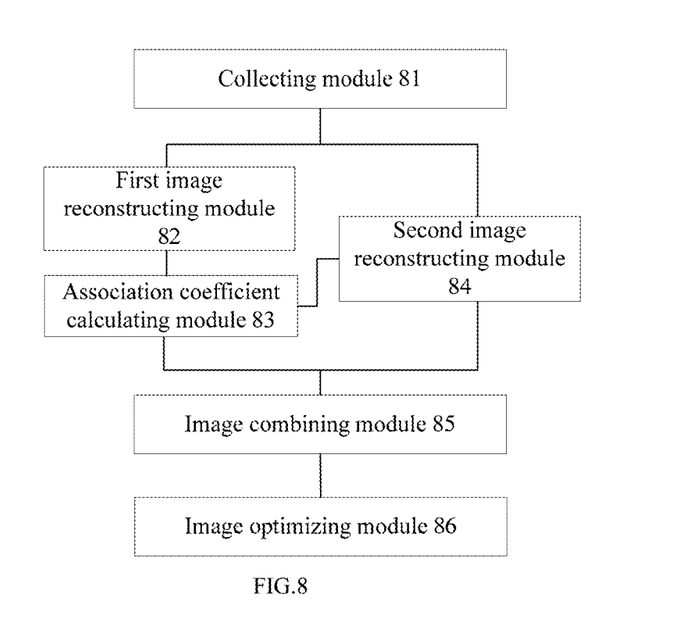
FIG. 8 is a block diagram of a device for reconstructing magnetic resonance images with different contrasts.

The machine readable storage medium 730 stores control logic 800 for reconstructing magnetic resonance images with different contrasts. As shown in FIG. 8, functionally, the control logic includes: a collecting module 81, a first image reconstructing module 82, an association coefficient calculating module 83, a second image reconstructing module 84, and an image combining module 85.

The collecting module 81 is configured to collect magnetic resonance signal data of each of N contrasts during N magnetic resonance scan, wherein the magnetic resonance signal data is recorded in k-space, and N is an integer greater than or equal to 2.

The first image reconstructing module 82 can be configured to reconstruct a first image for each of the N contrasts according to the magnetic resonance signal data corresponding to the contrast.

The association coefficient calculating module 83 can be configured to obtain an association coefficient of each of the N contrasts according to the first image for each of the N contrasts.

The second image reconstructing module 84 can be configured to obtain a second image shared with the N contrasts based on the magnetic resonance signal data of the N contrasts and the association coefficient of each of the N contrasts.

The image combining module 85 can be configured to obtain a reconstructed image for each of the N contrasts by combining the association coefficient of the contrast with the second image shared with the N contrasts.

To improve final images with different contrasts in better quality, the reconstructing apparatus can include an image optimizing module 86.

The image optimizing module 86 can be configured to obtain a target image for each of the contrasts by optimizing the reconstructed image for the contrast.

A software implementation is taken as an example below to describe how a device can execute the control logic 800 of reconstructing magnetic resonance images with different contrasts. In this example, the control logic 800 of the present disclosure can be computer instructions stored in the machine readable storage medium 730. When the one or more processors 710 on the control device execute the control logic 800, the one or more processors 710 can perform the following operations by invoking instructions corresponding to the control logic 800 stored on the machine readable storage medium 730.

Magnetic resonance signal data of each of N contrasts is collected during N magnetic resonance scan, wherein the magnetic resonance signal data is recorded in k-space, and N is an integer greater than or equal to 2.

A first image for each of the N contrasts is obtained by performing image reconstruction according to the magnetic resonance signal data corresponding to the contrast.

An association coefficient of each of the N contrasts is obtained according to the first image for each of the N contrasts.

A second image shared with the N contrasts is obtained by performing image reconstruction based on the magnetic resonance signal data of the N contrasts and the association coefficient of each of the N contrasts.

A reconstructed image for each of the N contrasts is obtained by combining the association coefficient of the contrast with the second image shared with the N contrasts.

In the reconstructing device described above for reconstructing magnetic resonance images with different contrasts, the first image for each of the contrasts can be reconstructed according to the magnetic resonance signal data corresponding to the contrast. An association coefficient corresponding to the contrast is calculated. The second image shared under N contrasts can be reconstructed by using the magnetic resonance signal data and the association coefficients. A complete reconstructed image for the contrast can be generated by combining the association coefficient corresponding to the contrast with the shared second image.

In this device, the association coefficient calculated based on the first image can be added during reconstruction of the second image, which takes into account the impact of the contrast on the shared second image and reduces contrast contamination. This enables the device for reconstructing magnetic resonance images with different contrasts to increase the imaging accuracy and improve the imaging quality.

Further, in of the approaches described here for reconstructing an image, a process of reconstructing the first image and a process of reconstructing the shared second image can be two different processes. Since a characteristic of approximately same tissue structure information is used in the method of the present disclosure, a ratio between the reconstructed image of each contrast and the shared image is approximately equal to the association coefficient calculated based on the first images. In some examples, the second signal data can be collected only once for a particular contrast during data collection, and the first signal data can be collected for each contrast. This approach can enable repeated scans of the second signal data to be avoided, saving the scanning time.

The approaches described here for reconstruction of magnetic resonance images with different contrasts can enable relatively quick and accurate reconstruction.

When the one or more processors collecting the magnetic resonance signal data of the contrast by reading machine-readable instructions corresponding to the control logic in a storage medium, the following may be included.

Magnetic resonance scanning parameters of the contrast are set.

J groups of k-space magnetic resonance signal data of the contrast are collected by scanning in an equidistant under-sampling manner according to the set magnetic resonance scanning parameters, wherein J indicates a number of collecting channels and is an integer greater or equal to 2.

When the processor obtaining the first image for the contrast by reading machine-readable instructions corresponding to the control logic in a storage medium, the followings may be specifically included.

A pre-processed image for the contrast is reconstructed with the J groups of k-space magnetic resonance signal data of the contrast.

The first image for a contrast is obtained by removing noise and artifacts from the pre-processed image for the contrast.

When the one or more processors obtaining the association coefficient of the contrast by reading machine-readable instructions corresponding to the control logic in a storage medium, the following may be included.

An average image is obtained from the first images with N contrasts.

An association coefficient of the contrast is obtained by dividing the first image for the contrast by the average image.

When the one or more processors obtaining the second image shared with the N contrasts by reading machine-readable instructions corresponding to the control logic in a storage medium, the following may be included.

J*N equations (4) are established.

The second image shared with the N contrasts is obtained by simultaneous solving the J*N equations.

When the one or more processors combining the association coefficient of the second image with the second image by reading machine-readable instructions corresponding to the control logic in a storage medium, the following may be specifically included.

The association coefficient corresponding to the contrasts is multiplied by the second image shared with the N contrasts.

After obtaining the reconstructed image for the contrast, the one or more processors may obtain a target image for the contrast by optimizing the reconstructed image for the contrast by reading machine-readable instructions corresponding to the control logic in a storage medium. The instructions include solving equation (6).

In some examples, when the one or more processors collect the magnetic resonance signal data for the contrast, the following may be included.

The magnetic resonance signal data of a contrast corresponding to the center region of the k-space is collected by scanning in a full-sampling manner according to the set magnetic resonance scanning parameters, wherein the magnetic resonance signal data is configured to reconstruct the first images for the contrast.

In some examples, when the one or more processors collect the magnetic resonance signal data for a contrast, the following may be specifically included.

Magnetic resonance scanning parameters of the contrast are set.

The magnetic resonance signal data of the contrast which corresponds to a central region of the k-space is collected by scanning in a full-sampling manner based on a preset collecting trajectory and the set magnetic resonance scanning parameters. Where the preset collecting trajectory may be a spiral trajectory or a radial trajectory. J indicates a number of collecting channels, and J groups of magnetic resonance signal data are collected of each contrast.

When the one or more processors obtain the second image shared with the N contrasts, the following may be included.

J*N equations (7) are established.

The second image shared with the N contrasts is obtained by simultaneous solving a minimum solution of the J*N equations.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description provides examples and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

What is claimed is:

1. A method of reconstructing magnetic resonance images with different contrasts, comprising:
   collecting magnetic resonance signal data of each of N contrasts during N magnetic resonance scans, wherein the magnetic resonance signal data is recorded in k-space, and N is an integer greater than or equal to 2, wherein collecting magnetic resonance signal data of each of N contrasts during N magnetic resonance scans comprises:
      collecting magnetic resonance signal data of a particular contrast during a particular magnetic resonance scan of the N magnetic resonance scans;
   obtaining a first image for each of the N contrasts by performing image reconstruction according to the magnetic resonance signal data corresponding to the contrast;
   obtaining an association coefficient of each of the N contrasts according to the first image for the contrast, wherein obtaining an association coefficient of each of the N contrasts comprises:
      obtaining an average image from the first images for the N contrasts, and
      obtaining an association coefficient of the particular contrast by dividing a first image for the particular contrast by the average image;
   obtaining a second image shared with the N contrasts by performing image reconstruction based on the magnetic resonance signal data of the N contrasts and the association coefficients of the N contrasts; and
   obtaining a reconstructed image for each of the N contrasts by combining the association coefficient of the contrast with the second image shared with the N contrasts.

2. The method of claim 1, wherein collecting magnetic resonance signal data of a particular contrast comprises:
   setting magnetic resonance scanning parameters for the particular contrast; and
   collecting J groups of k-space magnetic resonance signal data for the particular contrast by scanning in an equidistant undersampling manner according to the set magnetic resonance scanning parameters, wherein J indicates a number of collecting channels and is an integer greater or equal to 2.

3. The method of claim 2, wherein collecting magnetic resonance signal data of a particular contrast comprises:
   collecting second magnetic resonance signal data corresponding to a central region of the k-space for the particular contrast by scanning in a full-sampling manner according to the set magnetic resonance scanning parameters, and
   wherein obtaining a first image for each of the N contrasts comprises:
      reconstructing the first image for the particular N contrast according to the second magnetic resonance signal data corresponding to the central region of the k-space for the particular contrast.

4. The method of claim 2, wherein obtaining a first image for each of the N contrasts comprises:
   reconstructing a pre-processed image for the particular contrast with the J groups of k-space magnetic resonance signal data of the particular contrast; and obtaining the first image for the particular contrast by removing noise and artifacts from the pre-processed image for the particular contrast.

5. The method of claim 1, wherein obtaining an average image from the first images for the N contrasts comprises:
obtaining the average image according to an equation $LI_{ave}=\Sigma_{n=1}^{N}LI^n/N$, wherein
$LI_{ave}$ refers to the average image,
n refers to a serial number assigned to each of the N contrasts, n∈{1, 2, 3, . . . , N}, and
$LI^n$ refers to the first image for contrast n; and
wherein obtaining an association coefficient of the particular contrast comprises:
obtaining the association coefficient of the particular contrast according to an equation $rI^n=LI^n/LI_{ave}$, wherein $rI^n$ refers to an association coefficient of contrast n.

6. The method of claim 2, wherein obtaining a second image shared with the N contrasts comprises:
establishing J*N equations $I_j^n(X)=\Sigma_{L=1}^{R}I_{ave}(X_L)rI^n(X_L)C_j(X_L)$, wherein
n refers to a serial number assigned to each of the N contrasts, n∈{1, 2, 3, . . . , N},
j refers to a serial number assigned to each of the J collecting channels, j∈{1, 2, 3, . . . , J},
$I_j^n(X)$ refers to data of an X-th point in a folded image corresponding to the j-th channel and the n-th contrast,
R refers to an acceleration factor when scanning in an undersampling manner,
$X_L$ refers to a L-th point corresponding to the data $I_j^n(X)$ in an unfolded image, L∈{1, 2, 3, . . . , R},
$rI^n(X_L)$ refers to an association coefficient of the point $X_L$ of the n-th contrast,
$I_{ave}(X_L)$ refers to a value of the point $X_L$ in the second image to be solved,
$C_j(X_L)$ indicates a sensitivity in the j-th channel according to the point $X_L$; and
obtaining the second image shared with the N contrasts by simultaneously solving the J*N equations.

7. The method of claim 2, further comprising:
obtaining a target image for each of the N contrasts by optimizing the reconstructed image for the contrast according to an expression as follows:

$$\hat{I}^n = \arg\min_{\hat{I}^n}\left\{\sum_{j=1}^{J} \|A_j\hat{I}^n - I_j^n\|_2^2 + \lambda \|\hat{I}^n - I^n\|_2^2\right\},$$

wherein, argmin refers to argument of the minimum,
n refers to a serial number assigned to each of the N contrasts, n∈{1, 2, 3, . . . , N},
j refers to a serial number assigned to each of the collecting channels, j∈{1, 2, 3, . . . , J},
$A_j$ refers to an aliased encoding matrix corresponding to the j-th channel,
$I_j^n$ refers to a folded image corresponding to the j-th channel and the n-th contrast,
$I^n$ refers to the reconstructed image for the n-th contrast,
λ refers to a weighting parameter,
$\|\ \|_2^2$ refers to a square of an L2 norm, and
$\hat{I}^n$ refers to a target image for the n-th contrast.

8. The method of claim 1, wherein collecting magnetic resonance signal data of a particular contrast comprises:
setting magnetic resonance scanning parameters of the particular contrast;
collecting J groups of k-space first magnetic resonance signal data for the particular contrast by scanning in an equidistant undersampling manner according to the set magnetic resonance scanning parameters, wherein J indicates a number of collecting channels and is an integer greater or equal to 2; and
collecting second magnetic resonance signal data of the particular contrast which corresponds to a central region of the k-space by scanning in a full-sampling manner based on a preset collecting trajectory and the set magnetic resonance scanning parameters, wherein the preset collecting trajectory comprises a spiral trajectory and a radial trajectory.

9. The method of claim 8, wherein obtaining a second image shared with the N contrasts comprises:
establishing J*N equations $$\min_{I_{ave}} \sum_{j=1,n=1}^{j=J,n=N} \|\Gamma(I_{ave} \cdot rI^n \cdot C_j) - K_j^n\|^2,$$

wherein
Γ refers to an operation comprising a Fourier transform, a meshing algorithm according to the preset collecting trajectory,
j refers to a serial number assigned to each of the J collecting channels, J∈{1, 2, 3, . . . , J},
n refers to a serial number assigned to each of the N contrasts, n∈{1, 2, 3, . . . , N},
$C_j$ refers to a sensitivity of the j-th channel,
$I^n$ refers to the reconstructed image for the n-th contrast,
$I_{ave}$ refers to the second image to be solved,
$K_j^n$ refers to the first magnetic resonance signal data corresponding to the j-th channel and the n-th contrast; and
obtaining the second image shared with the N contrasts by simultaneously solving a minimum solution of the J*N equations.

10. The method of claim 8, further comprising:
obtaining a target image for each of the N contrasts by optimizing the reconstructed image for the contrast according to an expression as follows:

$$\hat{I}^n = \arg\min_{\hat{I}^n}\left\{\sum_{j=1}^{J} \|\Gamma(\hat{I}^n \cdot C_j) - K_j^n\|_2^2 + \lambda \|\hat{I}^n - I^n\|_2^2\right\},$$

wherein, argmin refers to argument of the minimum,
j refers to a serial number assigned to each of the J collecting channels, j∈{1, 2, 3, . . . , J},
n refers to a serial number assigned to each of the N contrasts, n∈{1, 2, 3, . . . , N},
$C_j$ refers to a sensitivity of the j-th channel,
$K_j^n$ refers to the first magnetic resonance signal data corresponding to the j-th channel and the n-th contrast,
$I^n$ refers to the reconstructed image with the n-th contrast,
λ refers to a weighting parameter,
$\|v_2^2$ refers to a square of an L2 norm, and
$\hat{I}^n$ indicates the target image for the n-th contrast.

11. The method of claim 1, wherein obtaining a reconstructed image for each of the N contrasts by combining the association coefficient of the contrast with the second image shared with the N contrasts comprises:

obtaining a reconstructed image for the particular contrast by multiplying the association coefficient of the particular contrast by the second image shared with the N contrasts.

12. A device for reconstructing magnetic resonance images with different contrasts, comprising one or more processors, wherein by reading and executing machine readable instructions corresponding to control logic for reconstructing magnetic resonance images with different contrasts in a machine readable storage medium, the one or more processors are caused to perform operations comprising:
   collecting magnetic resonance signal data of each of N contrasts during N magnetic resonance scans, wherein the magnetic resonance signal data is recorded in k-space, and N is an integer greater than or equal to 2, wherein collecting magnetic resonance signal data of each of N contrasts during N magnetic resonance scans comprises:
      collecting magnetic resonance signal data of a particular contrast during a particular magnetic resonance scan of the N magnetic resonance scans;
   obtaining a first image for each of the N contrasts by performing image reconstruction according to the magnetic resonance signal data corresponding to the contrast;
   obtaining an association coefficient of each of the N contrasts according to the first image for the contrast, wherein obtaining an association coefficient of each of the N contrasts comprises:
      obtaining an average image from the first images for the N contrasts, and
      obtaining an association coefficient of the particular contrast by dividing a first image for the particular contrast by the average image;
   obtaining a second image shared with the N contrasts by performing image reconstruction based on the magnetic resonance signal data of the N contrasts and the association coefficients of the N contrasts; and
   obtaining a reconstructed image for each of the N contrasts by combining the association coefficient of the contrast with the second image shared with the N contrasts.

13. The device of claim 12, wherein collecting magnetic resonance signal data of a particular contrast comprises:
   setting magnetic resonance scanning parameters of the particular contrast; and
   collecting J groups of k-space magnetic resonance signal data of the particular contrast by scanning in an equidistant undersampling manner according to the set magnetic resonance scanning parameters, wherein J indicates a number of collecting channels and is an integer greater or equal to 2.

14. The device of claim 13, wherein collecting magnetic resonance signal data of a particular contrast comprises:
   collecting second magnetic resonance signal data corresponding to a central region of the k-space by scanning in a full-sampling manner according to the set magnetic resonance scanning parameters, and
   wherein obtaining a first image for each of the N contrasts comprises:
      reconstructing the first image for the particular N contrast according to the second magnetic resonance signal data corresponding to the central region of the k-space for the particular contrast.

15. The device of claim 13, wherein obtaining a first image for each of the N contrasts comprises:
   reconstructing a pre-processed image for the particular contrast with the J groups of k-space magnetic resonance signal data of the particular contrast; and
   obtaining the first image for the particular contrast by removing noise and artifacts from the pre-processed image for the contrast.

16. The device of claim 12, wherein obtaining an average image from the first images for the N contrasts comprises:
   obtaining the average image according to an equation $LI_{ave} = \Sigma_{n=1}^{N} LI^n/N$, wherein
      $LI_{ave}$ refers to the average image,
      n refers to a serial number assigned to each of the N contrasts, $n \in \{1, 2, 3, \ldots, N\}$, and
      $LI^n$ refers to the first image for contrast n; and
   wherein obtaining an association coefficient of the particular contrast comprises:
      obtaining the association coefficient of the particular contrast according to an equation $rI^n = LI^n/LI_{ave}$, wherein $rI^n$ refers to an association coefficient of contrast n.

17. The device of claim 13, wherein obtaining a second image shared with the N contrasts comprises:
   establishing J*N equations $I_j^n(X) = \Sigma_{L=1}^{R} I_{ave}(X_L) rI^n(X_L) C_j(X_L)$, wherein
      n refers to a serial number assigned to each of the N contrasts, $n \in \{1, 2, 3, \ldots, N\}$,
      j refers to a serial number assigned to each of the J collecting channels, $j \in \{1, 2, 3, \ldots, J\}$,
      $I_j^n(X)$ refers to data of an X-th point in a folded image corresponding to the j-th channel and the n-th contrast,
      R refers to an acceleration factor when scanning in an undersampling manner,
      $X_L$ refers to a L-th point corresponding to the data $I_j^n(X)$ in an unfolded image, $L \in \{1, 2, 3, \ldots, R\}$,
      $rI^n(X_L)$ refers to an association coefficient of the point $X_L$ of the n-th contrast,
      $I_{ave}(X_L)$ refers to a value of the point $X_L$ in the second image to be solved,
      $C_j(X_L)$ indicates a sensitivity in the j-th channel according to the point $X_L$; and
   obtaining the second image shared with the N contrasts by simultaneously solving the J*N equations.

18. The device of claim 12, wherein collecting magnetic resonance signal data of a particular contrast comprises:
   setting magnetic resonance scanning parameters of the particular contrast;
   collecting J groups of k-space first magnetic resonance signal data for the particular contrast by scanning in an equidistant undersampling manner according to the set magnetic resonance scanning parameters, wherein J indicates a number of collecting channels and is an integer greater or equal to 2; and
   collecting second magnetic resonance signal data of the particular contrast which corresponds to a central region of the k-space by scanning in a full-sampling manner based on a preset collecting trajectory and the set magnetic resonance scanning parameters, wherein the preset collecting trajectory comprises a spiral trajectory and a radial trajectory.

19. The device of claim 18, wherein obtaining a second image shared with the N comprises:
   establishing J*N equations $$\min_{I_{ave}} \Sigma_{j=1,n=1}^{j=J,n=N} \| \Gamma(I_{ave} \cdot rI^n \cdot C_j) - K_j^n \|^2,$$

wherein

Γ refers to an operation comprising a Fourier transform, a meshing algorithm according to the preset collecting trajectory, j refers to a serial number assigned to each of the J collecting channels j∈{1, 2, 3, ..., J}, n refers to a serial number assigned to each of the N contrasts n∈{1, 2, 3, ..., N}, $C_j$ refers to a sensitivity of the j-th channel, $I^n$ refers to the reconstructed image for the n-th contrast, $I_{ave}$ refers to the second image to be solved, $K_j^n$ refers to the first magnetic resonance signal data corresponding to the j-th channel and the n-th contrast; and obtaining the second image shared with the N contrasts by simultaneous solving a minimum solution of the J*N equations.

20. The device of claim 12, wherein obtaining a reconstructed image for each of the N contrasts by combining the association coefficient of the contrasts with the second image shared with the N contrasts comprises:

obtaining a reconstructed image for the particular contrast by multiplying the association coefficient of the contrast by the second image shared with the N contrasts.

* * * * *